United States Patent
Kimball

(10) Patent No.: US 8,786,381 B2
(45) Date of Patent: Jul. 22, 2014

(54) TRANSFORMER STRUCTURES FOR A POWER AMPLIFIER (PA)

(75) Inventor: Eric Kimball, Austin, TX (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 1059 days.

(21) Appl. No.: 12/824,866

(22) Filed: Jun. 28, 2010

(65) Prior Publication Data

US 2011/0316624 A1 Dec. 29, 2011

(51) Int. Cl.
*H01P 1/00* (2006.01)
*H01F 27/28* (2006.01)
*H03H 7/00* (2006.01)

(52) U.S. Cl.
USPC .......................... 333/24 R; 333/238; 336/182

(58) Field of Classification Search
USPC ............. 333/24 R, 32, 33, 236, 238; 336/182
See application file for complete search history.

(56) References Cited

U.S. PATENT DOCUMENTS

| | | | |
|---|---|---|---|
| 4,580,111 A | 4/1986 | Swanson | |
| 4,593,251 A | 6/1986 | Smith | |
| 4,680,559 A | 7/1987 | Swanson | |
| 4,703,283 A | 10/1987 | Samuels | |
| 5,264,810 A | 11/1993 | Sager et al. | |
| 5,570,062 A | 10/1996 | Dent | |
| 5,872,481 A | 2/1999 | Sevic et al. | |
| 5,930,128 A | 7/1999 | Dent | |
| 6,069,525 A | 5/2000 | Sevic et al. | |
| 6,294,955 B1 | 9/2001 | Luu et al. | |
| 6,731,166 B1 | 5/2004 | Sabouri et al. | |
| 6,996,379 B2 | 2/2006 | Khorram | |
| 7,079,818 B2 | 7/2006 | Khorram | |
| 7,095,283 B2 | 8/2006 | Kee et al. | |
| 7,129,784 B2 | 10/2006 | Bhatti et al. | |
| 7,157,965 B1 * | 1/2007 | Kim | 330/124 R |
| 7,161,427 B2 | 1/2007 | Westwick et al. | |
| 7,199,679 B2 * | 4/2007 | Mondal | 333/25 |
| 7,215,206 B2 | 5/2007 | Dupuis et al. | |
| 7,365,602 B2 | 4/2008 | Bhatti et al. | |
| 7,460,604 B2 | 12/2008 | Dupuis | |
| 7,461,281 B2 | 12/2008 | Miyazaki | |
| 7,629,860 B2 * | 12/2009 | Liu et al. | 333/25 |
| 7,728,661 B2 | 6/2010 | Bockelman | |
| 2005/0189995 A1 | 9/2005 | Kee et al. | |
| 2007/0096831 A1 | 5/2007 | Gao et al. | |

(Continued)

FOREIGN PATENT DOCUMENTS

EP 01229642 8/2002

OTHER PUBLICATIONS

U.S. Patent and Trademark Office, Office Action mailed Sep. 21, 2009 with Reply filed Dec. 17, 2009, in U.S. Appl. No. 12/151,199.

(Continued)

*Primary Examiner* — Dean O Takaoka
*Assistant Examiner* — Alan Wong

(57) ABSTRACT

In one embodiment, the present invention includes a transformer formed on a semiconductor die. Such transformer may have multiple coils, including first and second coils. Each coil may have segments that in turn are formed on a corresponding metal layer of the semiconductor die. The segments of a given coil are coupled to each other, and the first and second coils can be interdigitated with each other.

17 Claims, 7 Drawing Sheets

(56) References Cited

U.S. PATENT DOCUMENTS

| | | |
|---|---|---|
| 2007/0152780 A1* | 7/2007 | Liao et al. .................... 333/204 |
| 2008/0174396 A1* | 7/2008 | Choi et al. ................... 336/182 |
| 2008/0272875 A1* | 11/2008 | Huang et al. ................. 336/182 |
| 2008/0303606 A1* | 12/2008 | Liu et al. ........................ 333/25 |
| 2009/0256631 A1 | 10/2009 | Bockelman |
| 2009/0273397 A1 | 11/2009 | Bockelman et al. |
| 2009/0278609 A1 | 11/2009 | Srinivasan et al. |

OTHER PUBLICATIONS

U.S. Patent and Trademark Office, Notice of Allowance mailed Jan. 11, 2010, U.S. Appl. No. 12/151,199.

U.S. Appl. No. 12/317,819, filed Dec. 30, 2008, entitled "An Output Gain Stage for a Power Amplifier," by Vishnu Srinivasan, et al.

U.S. Patent and Trademark Office, Notice of Allowance mailed on Feb. 24, 2010 in U.S. Appl. No. 12/317,819.

PCT/US2009/036480 International Search Report dated Sep. 28, 2009.

RF Micro Devices, Inc., "RF2173, 3V GSM Power Amplifier, Package Style: QFN, 16-Pin, 4×4," 2006, pp. 1-14.

RF Micro Devices, Inc., "What's Next in UMTS Front-Ends," 2007, pp. 1-2.

Anadigics, "AWT6278R, HELP3 PCS/WCDMA 3.4 V/29.5 dBm, Linear Power Amplifier Module, Data Sheet—Rev. 2.0," Jan. 2007, pp. 1-8.

* cited by examiner

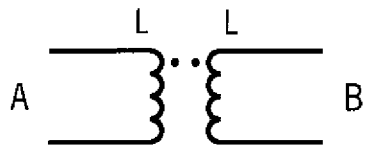
FIG. 1A
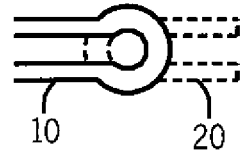
FIG. 1B
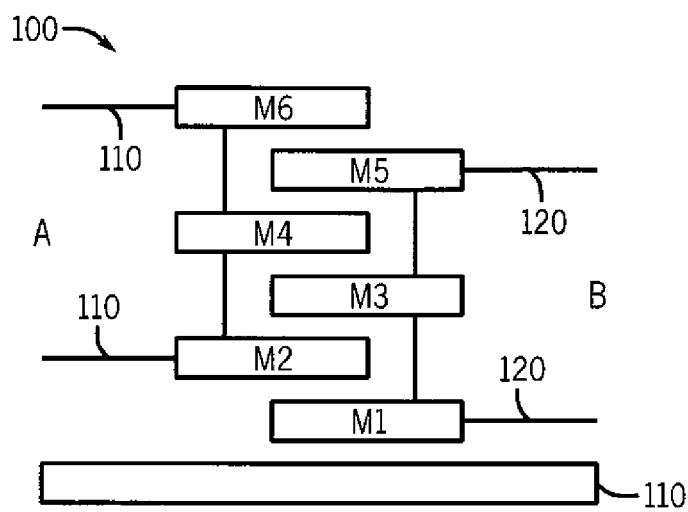
FIG. 2
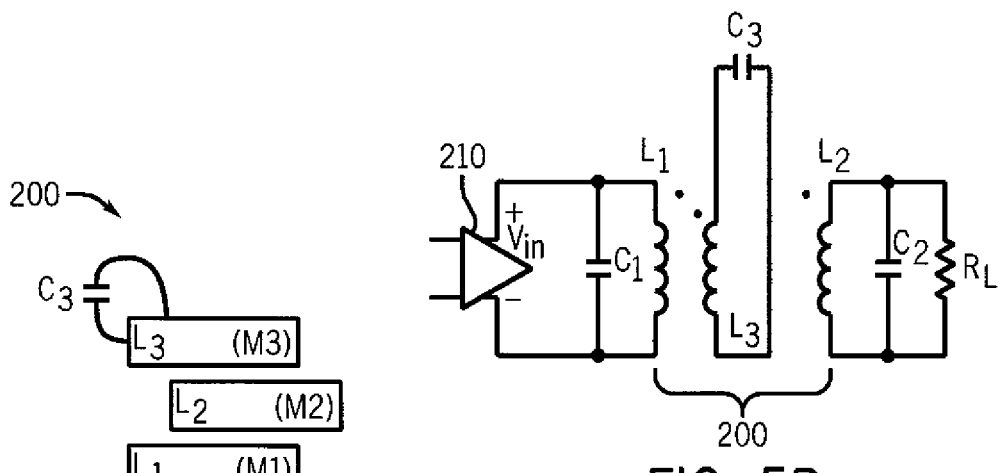
FIG. 5A
FIG. 5B

US 8,786,381 B2

TRANSFORMER STRUCTURES FOR A POWER AMPLIFIER (PA)

BACKGROUND

In semiconductor power amplifiers (PAs), which are used in a multitude of wireless devices such as cellular telephones, wireless portable devices and so forth, power amplification circuitry can be coupled to an output load by means of an output network. This output network can be in the form of a transformer having an input side coil and an output side coil. Conventionally, the input side coil is referred to as a primary coil and the output side coil is referred to as a secondary coil. These two coils are strongly coupled and have a coupling coefficient k therebetween.

As semiconductor technology advances, an output network including a transformer can be formed on a single semiconductor die. For example, the input side coil can be formed on a first metal layer formed on a substrate and the output side coil formed on a second metal layer formed on the substrate. Referring to FIG. 1A, which is a schematic representation of a prior art transformer, the input coil is referred to as port A and the output coil is referred to as port B. As seen in FIG. 1A, these two coils each have an inductance L and can be strongly coupled together. In a physical representation as shown in FIG. 1B, this transformer includes a first coil 10 that is formed on a first metal layer (e.g., M1) and a second coil 20 that is formed on a second metal layer (e.g., M2). The lines leading to the semi-circular portion of first coil 10 may be metal lines coupled to various circuitry, and similarly, the lines extending from second coil 20 may be metal lines coupled to other circuitry. The performance of this transformer structure, as represented by power efficiency, can improve as the metal layers thicken, up to a point. Eventually, the outer edges of the coils are too far apart and the coupling coefficient is reduced. At this point, a skin effect also reduces the amount of current flowing. Accordingly, techniques and structures to overcome such deficiencies are needed.

BRIEF DESCRIPTION OF THE DRAWINGS

FIG. 1A is a schematic diagram of a prior art transformer structure.

FIG. 1B is a top view of a prior art transformer structure.

FIG. 2 is a cross-sectional view of a transformer structure in accordance with an embodiment of the present invention.

FIG. 5A is a cross-sectional diagram of a M-coil transformer in accordance with an embodiment of the present invention.

FIG. 5B is a schematic diagram of an M-coil transformer in accordance with an embodiment of the present invention.

DETAILED DESCRIPTION

In various embodiments, an N-layer transformer structure may be provided, where N is greater than 2. In implementations for a 2-coil transformer structure, each coil can be implemented using multiple metal layers to form interdigitated coils across the various layers. Referring now to FIG. 2, shown is a cross-sectional view of a transformer structure in accordance with an embodiment of the present invention. As shown in FIG. 2, transformer 100 may be formed on a semiconductor substrate 110 having a plurality of metal layers formed thereon. The metal layers may themselves be separated by insulating layers formed therebetween (not shown in FIG. 2 for ease of illustration).

In the embodiment shown in FIG. 2, transformer 100 may be a 2-coil transformer, which can be schematically represented as described above with regard to FIG. 1A. However, as seen in FIG. 2, the structure of transformer 100 may be such that each coil is formed of metal segments present on different metal layers that are connected together. Specifically, port A may be formed of coils formed of segments of configured on metal layers M2, M4, and M6, while in turn port B may be formed of coils formed of segments of configured on metal layers M1, M3, and M5. The segments may take any desired form, and in some implementations may be configured such as shown in FIG. 1B with a substantially omega shape. Note that as to each port, corresponding metal layers of a given coil may be connected together by vias or other interconnection structures. As seen, the segments of each coil may be in close vertical alignment, and both coils are physically adjacent so that a substantial portion of the segments of each coil are in vertical or substantially vertical alignment. Also, note that an input signal, which may be a differential voltage received via lines 110, is coupled to segments formed on layers M2 and M5. Similarly, via electromagnetic coupling, an output signal, which may also be differential voltages, is coupled from segments on metal layers M1 and M5 and through lines 120 to, e.g., an output load. With this arrangement, a transformer having an improved power efficiency and Q or quality factor can be realized. More specifically, a structure such as transformer 100 of FIG. 2 may have the same inductance as a 2-coil transformer formed on two metal layers but may realize a higher coupling coefficient k and a higher Q value. Using this method it is possible to achieve a coupling coefficient closer to one (e.g., greater than approximately 0.9 in some embodiments) and the improvement in Q is limited only by the number of available metal layers and the required self resonant-frequency which decreases with each additional coil. Q is defined as:

$$Q = \frac{WL}{R} \qquad [\text{EQ. 1}]$$

where W is the frequency of interest, L is the inductance of the coil, and R is the resistance of the coil.

Figure 3:
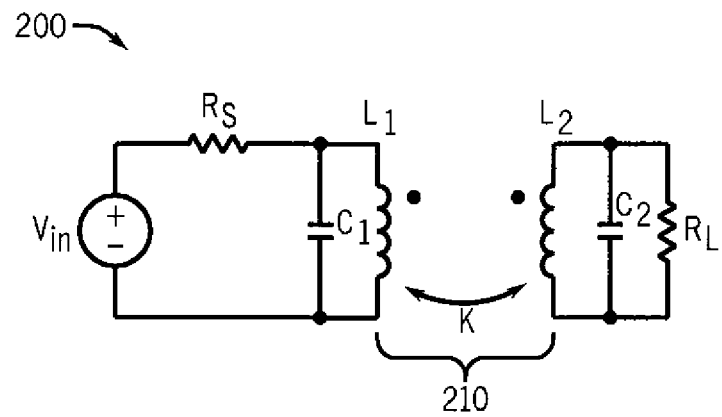
FIG. 3 is a schematic diagram of an output network in accordance with one embodiment of the present invention.

Referring now to FIG. 3, shown is a schematic diagram of an output network in accordance with one embodiment of the present invention. As shown in FIG. 3, network 200 includes a transformer 210 formed of a pair of coils L1 and L2 having a coupling coefficient k therebetween. In various embodiments, each coil can be formed on multiple metal layers. On the input side, an input voltage $V_{in}$ may be provided through a source resistance $R_S$ to first coil L1. Note further that a tuning capacitance $C_1$ is coupled in parallel to coil L1. In turn, on the secondary or output side, an output load is represented by a load resistance $R_L$ that is coupled in parallel with output coil L2 and a corresponding tuning capacitance $C_2$. While shown with this simplified view in FIG. 3, understand the scope of the present invention is not limited in this regard. For example, various components may be coupled at a front end of the input side, e.g., $V_{in}$ may be generated by a gain stage.

If one of the layers of the transformer is made out of a different material such as aluminum, the Q's of the coils may not be matched. For example, the primary coil could be made of copper which may be used due to its low sheet resistance and the secondary coil could be made out of aluminum, which has higher sheet resistance, but may be used as a top metal in many processes for ease of bond wire attachment. Capacitance and/or inductance can be adjusted on the primary and secondary coils in a conjugate match. For source resistance $R_S$ and load resistance $R_L$ the transformer has the following inductance and tuning capacitances.

$$L_1 = \frac{R_S}{W} - \frac{K\sqrt{\alpha}}{\alpha + K^2} \quad [\text{EQ. 2}]$$

$$L_2 = \frac{R_L}{W} - \frac{K\sqrt{\alpha}}{\alpha + K^2} \quad [\text{EQ. 3}]$$

$$C_1 = \frac{1}{W^2 L_1} - \frac{\alpha}{\alpha + K^2} \quad [\text{EQ. 4}]$$

$$C_2 = \frac{1}{W^2 L_2} - \frac{1}{1 + \alpha K^2} \quad [\text{EQ. 5}]$$

$$\alpha = \frac{Q_1}{Q_2} \quad [\text{EQ. 6}]$$

As seen, most of the above equations depend on the ratio of the inductor Q's, so by choosing which Q is associated with the primary or secondary, the determined L or C can be skewed. The purpose of this skew is to maintain a conjugate match which minimizes the losses when delivering power to a load. Furthermore if it is preferable to have more or less capacitance on one side of the transformer, it is possible to choose the metal layers for the primary and secondary so that the goal of skewing the capacitance from one side to the other is achieved.

Figure 4:
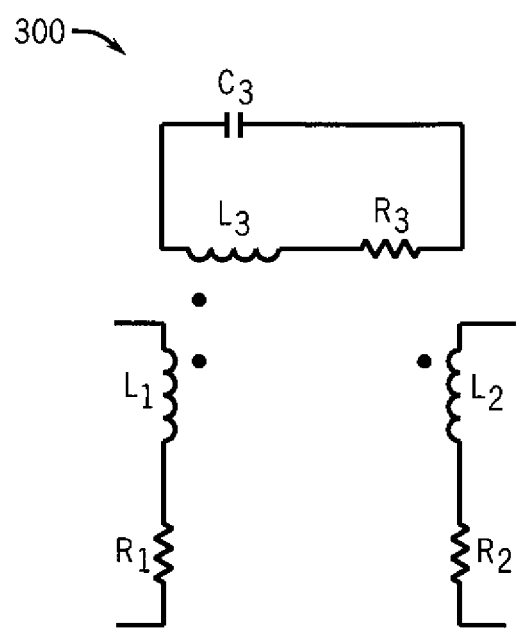
FIG. 4 is a schematic diagram of an M-coil transformer in accordance with an embodiment of the present invention.

A 2-coil transformer implementation such as that shown in FIG. 3 may suffer from insertion loss. Embodiments may further improve performance including insertion loss performance by providing an additional one or more capacitively tuned inductances that are commonly coupled to the first and second coils. Referring now to FIG. 4, shown is a schematic diagram of an M-coil transformer in accordance with an embodiment of the present invention, where M is greater than 2. As shown in FIG. 4, transformer 300 may be formed having three coils, namely coils L1, L2, and L3. As seen, each of the coils are coupled to every other coil with a non-zero coupling coefficient. In addition, each coil has a corresponding resistance $R_1$-$R_3$, which may be a parasitic resistance inherent in the inductors. As further seen, the additional coil $L_3$ may be a resonant coil that is a capacitively tuned inductance by way of a parallel-connected capacitance $C_3$. In various embodiments, this resonant capacitance may be in the form of a finger capacitor or metal-insulator-metal (MIM) capacitor, although other implementations are possible. Note that some current will flow through the additional coil, so a small amount of current loss may occur. However, the efficiency improvement to the other coils is large enough to offset such loss and this structure maintains much of the efficiency improvement that is achieved when all of the coils are connected in parallel as was previously described.

Note that an M-coil transformer can be implemented in an integrated circuit on M or more metal layers of a semiconductor die. Referring now to FIG. 5A, shown is a cross-sectional diagram of a 3-coil transformer in accordance with an embodiment of the present invention. As shown in FIG. 5A, transformer 200 may include three coils L1, L2, and L3, each coil of which may be formed on its own metal layer, namely corresponding metal layers M1-M3 in the embodiment of FIG. 5A. As seen, by providing these coils on portions of metal layers that are in close physical proximity to each other (e.g., in a vertical stack), a transformer having three coils that are closely commonly coupled within a high coupling coefficient can be realized. If the three-coil transformer is analyzed as a two-coil transformer, by ignoring the tuned third coil, the result is that the coupling coefficient appears to be greater than one and the Q of the coils is improved. While the circuit being analyzed is not a two-coil transformer, this analysis is useful for showing why the resulting insertion loss is improved. This improvement is due to the fact that the insertion loss of a conjugately matched two-coil transformer is only dependent on the coupling coefficient and the quality factor of the coils. This coupling between all the coils is in contrast to a situation where multiple two-coil transformers are present on a single semiconductor die, and the coils of each of the transformers are located at physically disparate portions of the die.

In different implementations, the coils may be formed on other metal layers. Or as described above, each coil may be formed of interdigitated segments on more than one metal layer. Furthermore, the ordering of the coils with regard to the metal layers can be different in different implementations. As seen in FIG. 5A, the third coil L3 may have a resonant capacitance $C_3$ coupled thereto. This resonant capacitance may be formed on the same or different metal layer than the third coil. Depending on an implementation, the first and second coils also may be coupled to tuning capacitances. Note that with this 3-coil design, a slightly different amount of capacitance may be used than in a 2-coil design, however the inductance values of the primary and secondary coils may remain the same as a 2-coil transformer. The inductance on the resonant coil can be a convenient value, e.g., based on a layout of the 3-coil transformer.

In many implementations, although a M>2 coil transformer is provided, only two coils are part of an active circuit. That is, an input signal received from first circuit components electrically coupled to a first coil (which may be an input side coil) is electromagnetically coupled via the first and second coils to second circuit components electrically coupled to an output side coil. In contrast, the only component electrically coupled to the third coil is a tuning capacitance.

Referring now to FIG. 5B, shown is a schematic diagram of an M-coil transformer in accordance with an embodiment of the present invention. As shown in FIG. 5B, transformer 200 includes coils L1, L2 and L3. As seen, coil L1 may be an input side coil to receive an input voltage from an electrically coupled gain stage 210. As seen, gain stage 210 may be a differential gain stage that provides a differential voltage $V_{in}$. In addition, a matching capacitance $C_1$ is coupled in parallel to coil L1. In turn, coil L2 may be an output side coil that electrically couples the electromagnetically induced signal $V_{in}$ to an output load $R_L$. As further seen, a matching capacitance $C_2$ may be coupled in parallel between coil L2 and the load resistance. In contrast, coil L3 may have nothing electrically coupled to it other than resonant capacitance $C_3$. Note that while shown with specific circuit components electrically coupled to the first and second coils, understand that in different implementations other types of circuits can be electrically coupled to these coils.

Figure 6:
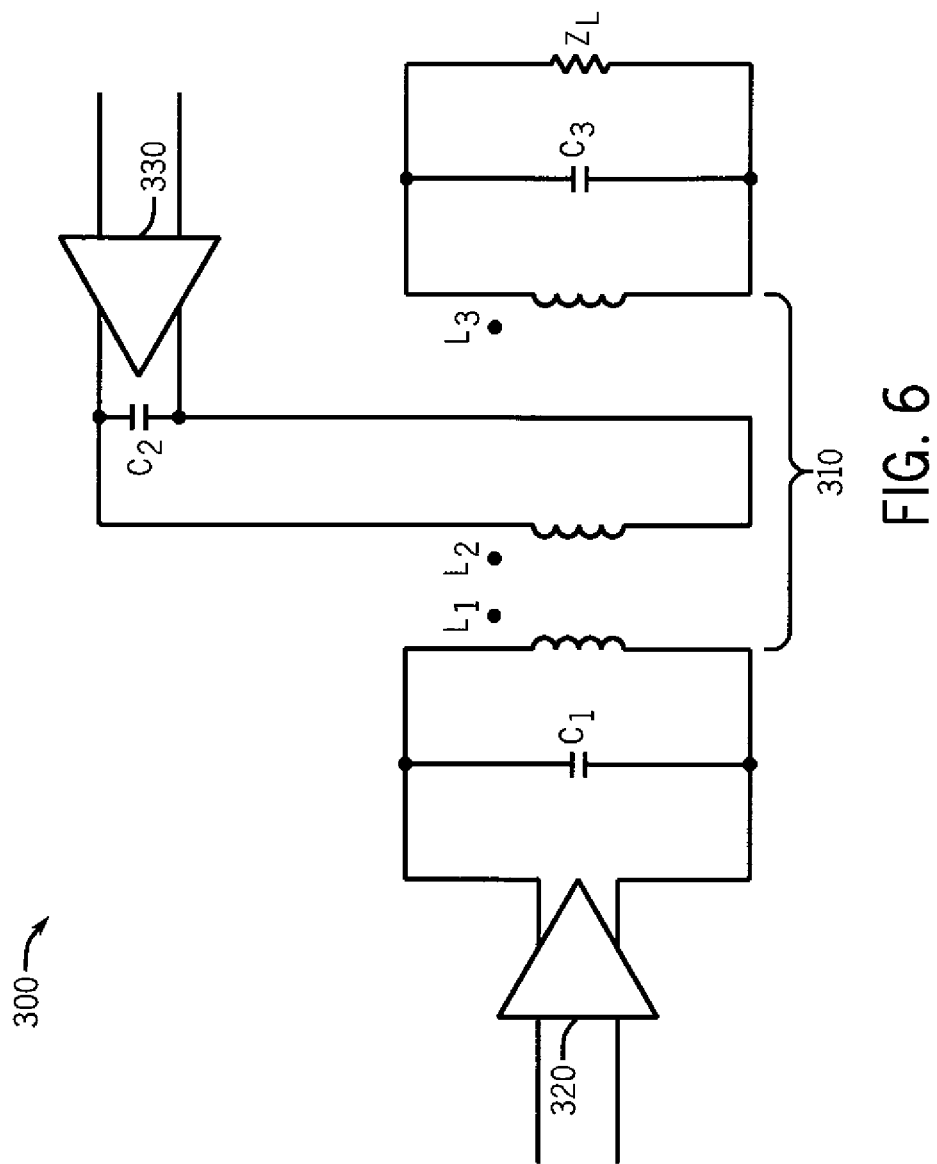
FIG. 6 is a schematic diagram of an output network having a 3-coil transformer in accordance with an embodiment of the present invention.

In yet further embodiments, circuits can be coupled to each of the M-coils to provide for improved flexibility for use in different applications. In certain embodiments, an M-coil transformer can be used in a PA. More specifically, using a 3-coil transformer, multiple gain stages can be coupled to an output load via a single transformer. Referring now FIG. 6, shown is a schematic diagram of an output network having a 3-coil transformer in accordance with an embodiment of the present invention. As shown in FIG. 6, output network arrangement 300 includes only a single transformer 310 having three coils, namely coils L1, L2, and L3, each of which are closely commonly coupled. As seen, first coil L1 and second coil L2 may be coupled to receive outputs of corresponding gain stages 320 and 330. In one embodiment, gain stage 320 may be a high power gain stage, while gain stage 330 may be a medium power gain stage. In a 3-coil transformer with two connected input paths, the inductance values may be selected based on the desired power transformations. For example, a high power gain stage may be coupled to a first coil having an inductance of 1×, where a second coil coupled to an output load may have an inductance of 4×. Similarly, a medium power gain stage may be coupled to a third coil having an inductance of 4×. However, the scope of the present invention is not limited in this regard and in other embodiments, the inductances and/or gain stages may be of equal powers. Alternatively, the designation of which gain stage is considered a high power stage and which gain stage is considered a lower power gain stage can be different.

As seen, each gain stage may be differentially coupled to the corresponding coil, and similarly, a corresponding tuning capacitance C1 and C2 may be coupled in parallel to the corresponding coil.

The output side of the transformer formed of coil L3 may be coupled in parallel to another tuning capacitance $C_3$ and an output load $Z_L$. By selecting various inductance ratios, different impedance transformations of the output load $Z_L$ can be realized. For example, if a 2:1 inductance ratio is used then a 2:1 impedance ratio will result.

In operation, outputs of both gain stages 320 and 330 may be active. However, in other power modes one or the other of the gain stages may be disabled. When a given gain stage is not in use, the gain stage may be placed in a high impedance (Hi-Z) or tristate mode. In this state, the tuning capacitance may still be coupled to the corresponding coil to maintain tuning of the coil such that the 3-coil arrangement still exists (such as shown in FIGS. 5A and 5B) and provides improvements in insertion loss, Q-factor and coupling efficiency. This mode is set by powering down the gain stage that is not in use and turning off the drive transistors, which results in a high output impedance for the gain stage.

Figure 7:
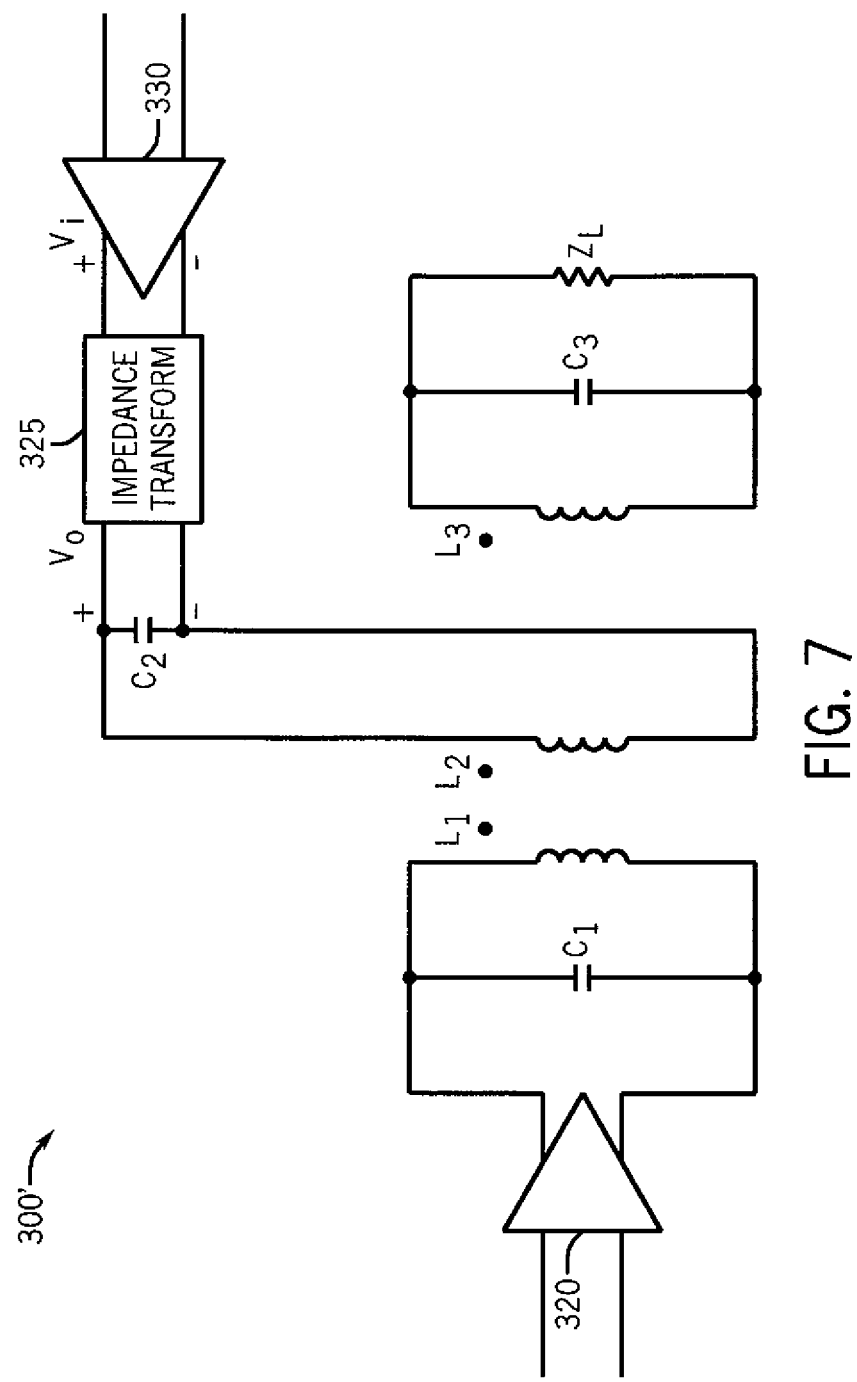
FIG. 7 is a schematic diagram of an output network arrangement in accordance with another embodiment of the present invention.

If a desired impedance transformation cannot be realized by selection of appropriate inductance ratios, an impedance transformation network may be provided between a corresponding gain stage and a coil. Referring now to FIG. 7, shown is a schematic diagram of an output network arrangement in accordance with another embodiment of the present invention. As shown in FIG. 7, network 300' may be configured with a 3-coil transformer, similar to that of FIG. 6. However, note the presence of an impedance transformation network 325 coupled between the output of gain stage 330 and second coil L2. This impedance transformation network 325 may thus be coupled in series along the differential output path from gain stage 330 to enable a desired impedance transformation of the signal output by gain stage 330. In addition to providing impedance transformation, this network may also provide input side protection. That is, assume a lower powered one of the gain stages is inactive, a large voltage may still appear at its output due to the enabled higher power gain stage. By providing impedance transformation, the non-enabled gain stage is electrically isolated from this voltage. Note that while the impedance transformation network is shown as being coupled to the medium power gain stage output, in some implementations such networks could be placed on any or all of the coils.

Figure 8A:
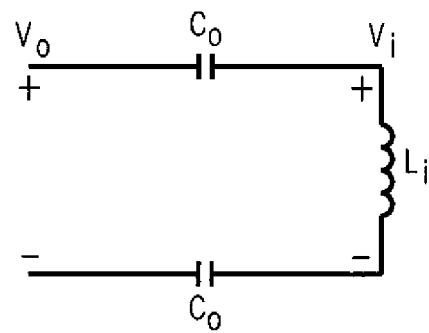
FIGS. 8A-8D are schematic diagrams of impedance transformation networks in accordance with embodiments of the present invention.
Figure 8B:
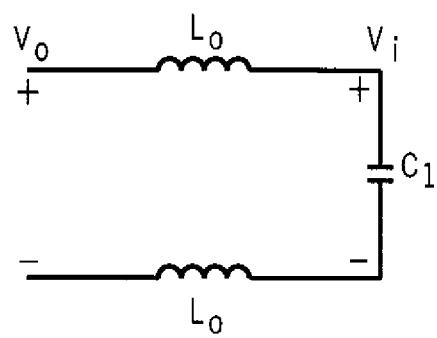
Figure 8C:
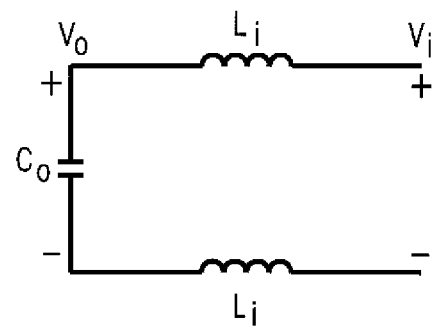
Figure 8D:
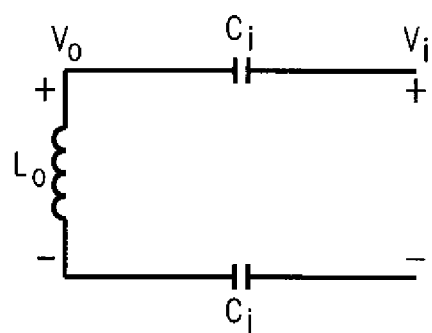

In different embodiments, different types of impedance transformation networks can be used. Specifically, implementations of such networks may be various combinations of LC circuits. As shown in FIG. 8A, an input parallel inductance and a pair of output capacitances C0 may be provided, or alternately as shown in FIG. 8B a pair of output inductances and a parallel input capacitance may be present. In yet other embodiments, an output parallel capacitance along with series input inductances can be provided as shown in FIG. 8C, or an output impedance L0 with input capacitances Ci, as shown in FIG. 8D may be present.

Figure 9:
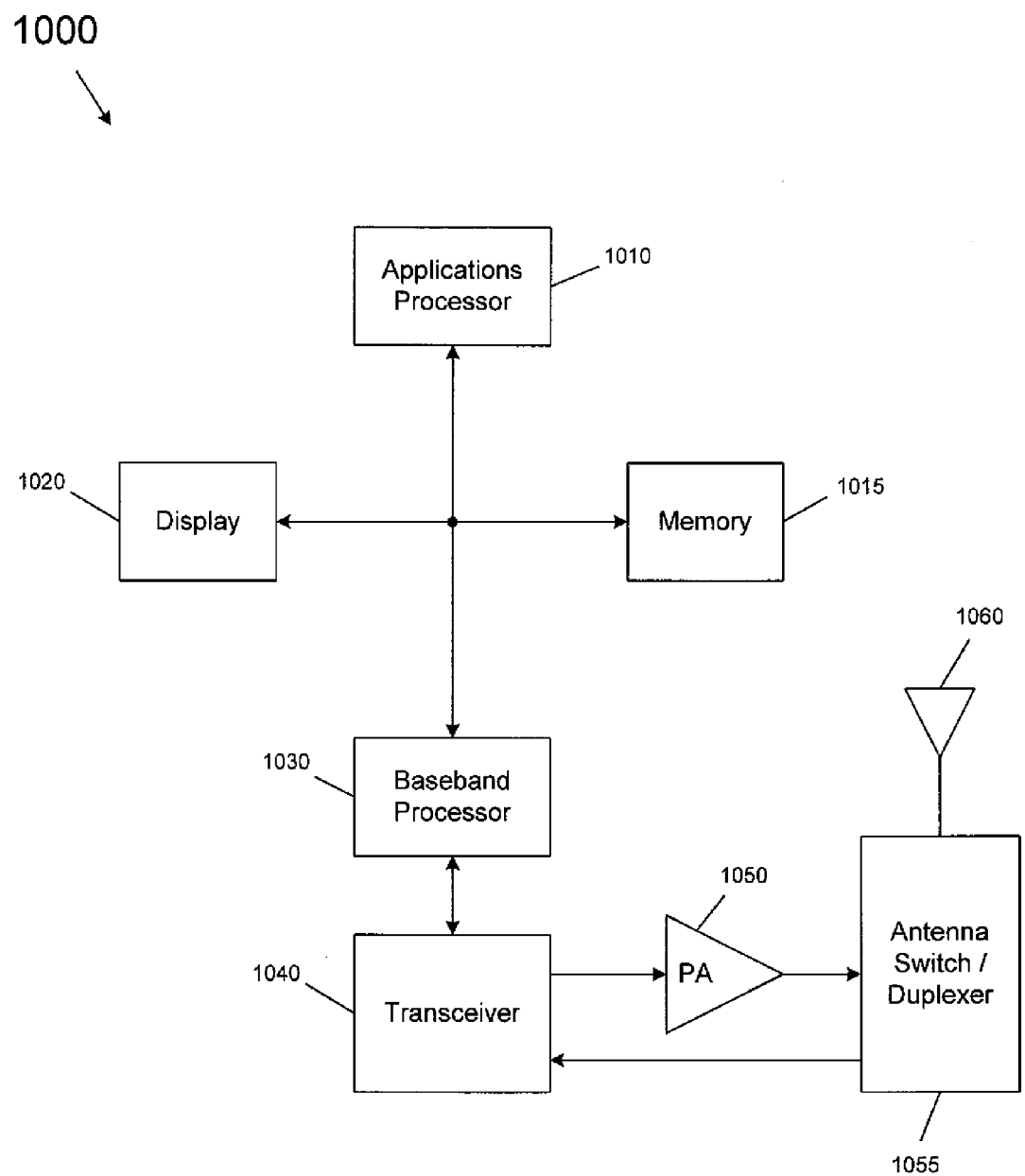
FIG. 9 is a block diagram of a wireless device in accordance with an embodiment of the present invention.

As described above, transformer configurations in accordance with an embodiment of the present invention can be incorporated in an output network of a PA such as a CMOS PA. Such a device can be used in various wireless systems, including handsets, mobile devices, PDAs and so forth. Referring now to FIG. 9, shown is a block diagram of a wireless device 1000 in accordance with an embodiment of the present invention. As shown in FIG. 9, wireless device 1000 may include an applications processor 1010 which may be a microprocessor or other programmable logic to handle various system features, such as running application programs desired by a user. To perform its functions, applications processor 1010 may communicate with a memory 1015, which may be a flash memory or other non-volatile memory. Applications processor 1010 may further communicate with a display 1020, such as an LCD display of the system. For handling RF communications, e.g., wireless phone calls, wireless data transmissions and so forth, e.g., according to a communications protocol such as EDGE or W-CDMA, applications processor 1010 may communicate with a baseband processor 1030, which may handle baseband operations both for transmit and receive paths. In turn, baseband processor 1030 is coupled to a transceiver 1040, which may receive incoming baseband signals from baseband processor 1030, and perform processing to upconvert the signals to RF levels for transmission to a PA 1050. PA 1050 may be a power amplifier in accordance with an embodiment of the present invention that includes one or more gain stages coupled to an output network having at least one transformer as described above. In turn, PA 1050 may be coupled to an antenna switch, duplexer or both 1055 which in turn is coupled to an antenna 1060, which radiates the amplified RF signal.

In a receive path, antenna 1060 couples through antenna switch 1055 and possibly through the duplexer or SAW filters and then to transceiver 1040, which may demodulate the incoming RF signals back to baseband for transmission to baseband processor 1030 for further processing. While shown with this particular implementation in the embodiment of FIG. 9, the scope of the present invention is not limited in this regard.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A transformer formed on a semiconductor die, the transformer comprising:
   a first coil comprising first segments each disposed over a corresponding one of a first plurality of metal layers of the semiconductor die, each of the first segments coupled to each other, at least one of the first plurality of metal layers comprising a first metal; and
   a second coil comprising second segments each disposed over a corresponding one of a second plurality of metal layers of the semiconductor die, each of the second segments coupled to each other, at least one of the second plurality of metal layers comprising a second metal, which is different from the first metal, wherein the first and second metals cause mismatch between the first and second coils.

2. The transformer of claim 1, wherein the first and second coils are interdigitated with each other.

3. The transformer of claim 1, wherein the number of first segments equals two.

4. The transformer of claim 1, wherein the number of first segments is greater than two.

5. The transformer of claim 1, further comprising a first tuning capacitor coupled in parallel with the first coil and a second tuning capacitor coupled in parallel with the second coil, wherein a value of the first and second tuning capacitors are different to compensate the mismatch.

6. The transformer of claim 1, wherein the first segments and the second segments are in substantially vertical alignment, and wherein the first and second coils have a coupling coefficient greater than approximately 0.9.

7. The transformer of claim 1, further comprising a third coil, the first second and third coils being inductively coupled to one another, and the third coil couples to a capacitance, wherein the third coil is a capacitively tuned inductance.

8. The transformer of claim 7, wherein the third coil is a resonant coil and the capacitance is connected in parallel with the third coil.

9. The transformer of claim 7, wherein the third coil comprises third segments each formed on a corresponding one of a third plurality of metal layers of the semiconductor die, each of the third segments being coupled to each other.

10. The transformer of claim 7, wherein the capacitance comprises a finger capacitor or a metal-insulator-metal (MIM) capacitor.

11. An apparatus comprising:
    a N-coil transformer, wherein N is greater than 2, the N-coil transformer including:
      a first coil formed on a first layer of a semiconductor die;
      a second coil formed on a second layer of the semiconductor die; and
      a third coil formed on a third layer of the semiconductor die, wherein only
        the third coil is coupled to a tuning capacitance to tune an inductance of the third coil to the first and second coils, and each of the first, second and third coils are coupled to each of the other coils with a non-zero coupling coefficient.

12. The apparatus of claim 11, further comprising a first gain stage coupled to provide an amplified signal to the first coil, and an output load coupled to the second coil to output the amplified signal to an antenna.

13. The apparatus of claim 12, wherein the tuning capacitance is coupled in parallel to the third coil.

14. The apparatus of claim 11, wherein the tuning capacitance comprises a capacitor formed on a different layer of the semiconductor die than the third layer.

15. The apparatus of claim 11, wherein the first, second and third coils are each formed of segments formed on a plurality of layers of the semiconductor die, each of the first, second and third coils interdigitated with each other.

16. The apparatus of claim 11, wherein at least one of the second plurality of metal layers comprises a second metal, which is different from the first metal, and the first and second metals cause mismatch between the first and second coils.

17. The apparatus of claim 11, wherein the capacitance comprises a finger capacitor or a metal-insulator-metal (MIM) capacitor.

* * * * *